(12) United States Patent
Sherrod et al.

(10) Patent No.: US 7,817,430 B2
(45) Date of Patent: Oct. 19, 2010

(54) AIRFLOW ADJUSTMENT IN AN ELECTRONIC MODULE ENCLOSURE

(75) Inventors: David W. Sherrod, Tomball, TX (US); Wade D. Vinson, Magnolia, TX (US); Michael E. Taylor, Houston, TX (US); Arthur G. Volkmann, Houston, TX (US); Troy A Della Fiora, Spring, TX (US); George D. Megason, Spring, TX (US); Chong Sin Tan, Houston, TX (US); Alan B. Doerr, Magnolia, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 163 days.

(21) Appl. No.: 12/138,189

(22) Filed: Jun. 12, 2008

(65) Prior Publication Data

US 2008/0310100 A1 Dec. 18, 2008

Related U.S. Application Data

(60) Provisional application No. 60/943,426, filed on Jun. 12, 2007.

(51) Int. Cl.
*H05K 5/00* (2006.01)
*H05K 7/20* (2006.01)
*G06F 1/20* (2006.01)
*A47G 19/08* (2006.01)

(52) U.S. Cl. .................. 361/724; 361/752; 361/679.46; 361/679.49; 361/679.51; 454/184; 211/41.17

(58) Field of Classification Search ................. 361/724, 361/752, 679.46, 679.49, 679.51, 687; 454/184; 211/41.17
See application file for complete search history.

(56) References Cited

U.S. PATENT DOCUMENTS

| | | | | | |
|---|---|---|---|---|---|
| 3,746,042 | A | * | 7/1973 | Finkel | 137/601.06 |
| 4,914,552 | A | * | 4/1990 | Kecmer | 361/801 |
| 5,010,426 | A | * | 4/1991 | Krenz | 360/97.01 |
| 5,269,698 | A | * | 12/1993 | Singer | 439/157 |
| 5,325,263 | A | * | 6/1994 | Singer et al. | 361/679.39 |
| 5,528,455 | A | * | 6/1996 | Miles | 361/695 |
| 5,668,696 | A | * | 9/1997 | Schmitt | 361/679.31 |
| 5,769,709 | A | * | 6/1998 | Kim | 454/318 |
| 5,769,710 | A | * | 6/1998 | Kim | 454/324 |
| 5,868,617 | A | * | 2/1999 | Kim | 454/324 |
| 5,940,266 | A | * | 8/1999 | Hamilton et al. | 361/695 |
| 6,042,348 | A | * | 3/2000 | Aakalu et al. | 417/423.5 |
| 6,047,836 | A | * | 4/2000 | Miles | 211/41.17 |
| 6,099,405 | A | * | 8/2000 | Cunningham, Jr. | 454/228 |
| 6,151,213 | A | * | 11/2000 | Ater et al. | 361/695 |
| 6,181,557 | B1 | * | 1/2001 | Gatti | 361/695 |
| 6,186,804 | B1 | * | 2/2001 | Smith et al. | 439/157 |
| 6,272,005 | B1 | * | 8/2001 | Jensen et al. | 361/679.41 |
| 6,278,608 | B1 | * | 8/2001 | Ater et al. | 361/695 |
| 6,342,004 | B1 | * | 1/2002 | Lattimore et al. | 454/184 |
| 6,381,147 | B1 | * | 4/2002 | Hayward et al. | 361/756 |
| 6,542,363 | B2 | * | 4/2003 | White | 361/695 |
| 6,685,489 | B1 | * | 2/2004 | Rubenstein et al. | 439/157 |
| 6,710,240 | B1 | * | 3/2004 | Chen et al. | 174/17 VA |

(Continued)

*Primary Examiner*—Jayprakash N Gandhi
*Assistant Examiner*—Bradley H Thomas

(57) ABSTRACT

An electronic module enclosure has a frame with an airflow opening. A gate positioned within airflow opening pivots between open and closed positions, allowing a maximum and minimum amount of airflow, respectively, through the airflow opening.

14 Claims, 9 Drawing Sheets

U.S. PATENT DOCUMENTS

| | | |
|---|---|---|
| 6,771,499 B2 | 8/2004 | Crippen et al. |
| 6,891,347 B2 | 5/2005 | Dobbs et al. |
| 7,201,651 B2* | 4/2007 | Su .................................. 454/184 |
| 7,252,439 B2 | 8/2007 | Takeuchi et al. |
| 7,355,850 B2* | 4/2008 | Baldwin, Jr. ................. 361/695 |
| 7,532,469 B2* | 5/2009 | Frank et al. .................. 361/695 |
| 7,646,601 B2* | 1/2010 | Zhang et al. ................. 361/695 |
| 2002/0032985 A1* | 3/2002 | Kim et al. ..................... 49/74.1 |
| 2003/0117779 A1* | 6/2003 | Gough et al. ................. 361/728 |
| 2004/0100765 A1* | 5/2004 | Crippen et al. .............. 361/687 |
| 2004/0252453 A1* | 12/2004 | Brooks et al. ................ 361/687 |
| 2004/0252456 A1* | 12/2004 | Larson et al. ................ 361/694 |
| 2005/0042982 A1* | 2/2005 | Okada et al. ................. 454/284 |
| 2006/0039108 A1* | 2/2006 | Chikusa et al. .............. 361/695 |
| 2006/0057952 A1* | 3/2006 | Kim ............................. 454/155 |
| 2006/0065874 A1* | 3/2006 | Campbell et al. ............ 251/348 |
| 2007/0087681 A1* | 4/2007 | Cook et al. ................... 454/256 |
| 2007/0091564 A1 | 4/2007 | Malone et al. |
| 2007/0183129 A1 | 8/2007 | Lewis, II et al. |
| 2007/0207720 A1* | 9/2007 | Henry et al. ................. 454/184 |
| 2008/0280552 A1* | 11/2008 | Baker et al. .................. 454/229 |
| 2009/0264063 A1* | 10/2009 | Tinsley et al. ............... 454/324 |

* cited by examiner

AIRFLOW ADJUSTMENT IN AN ELECTRONIC MODULE ENCLOSURE

CROSS-REFERENCE TO RELATED APPLICATIONS

This Utility Patent Application is based on and claims the benefit of U.S. Provisional Application No. 60/943,426, filed on Jun. 12, 2007, the contents of which are hereby incorporated by reference in their entirety.

BACKGROUND

Server enclosures may include a plurality of bays that house individual blade servers. A current option for providing cooling air to individual blade servers is to aggregate fans external to the servers in a location in the server enclosure. The fans can reside in a rear region of the enclosure while the blade servers are located in a front region. The fans pull air from a front of the enclosure and through the individual blade servers. A middle region between the fans and the servers may be charged with negative air pressure potential. To maintain proper airflow, current enclosures require that a server or a blank be installed in each bay. Otherwise, the individual blade servers may experience overheating and possible failure if a bay is left unoccupied.

DETAILED DESCRIPTION

In the following detailed description, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
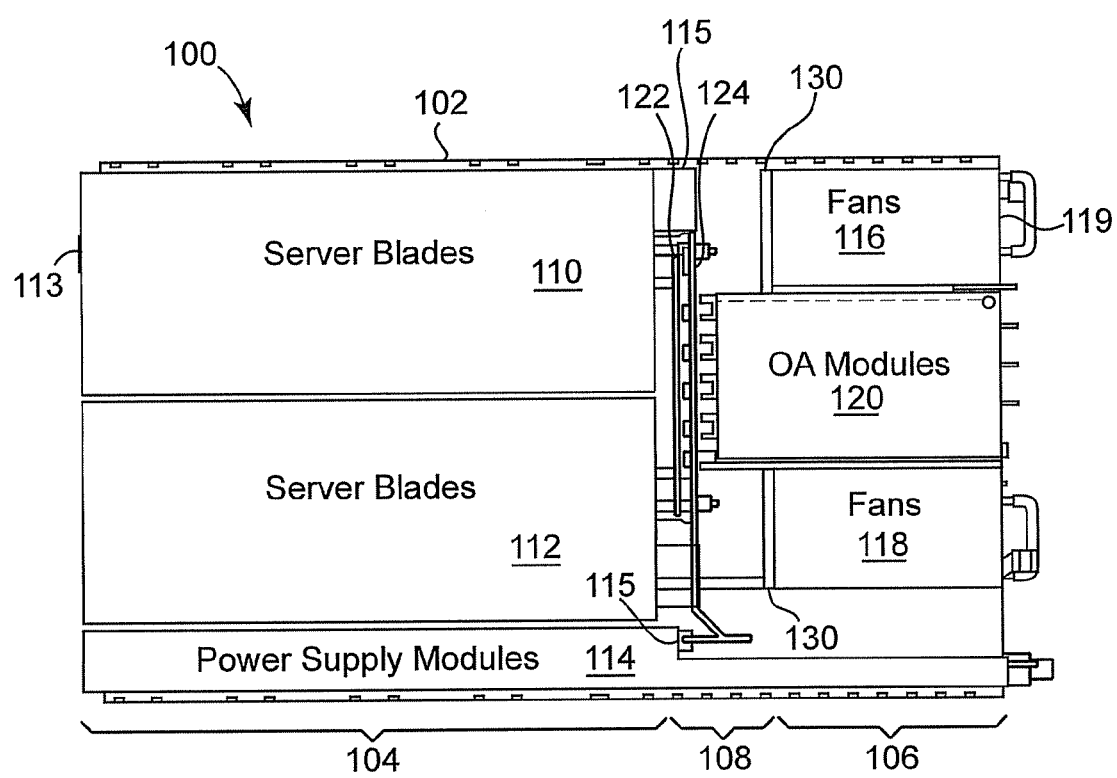
FIG. 1 is a side view of one embodiment of a server enclosure.

FIG. 1 is a schematic view of one embodiment of a computer enclosure 100. Enclosure 100 includes a chassis 102 that is arranged in a front region 104, a back region 106 and a central plenum 108 positioned between the front region 104 and the back region 106. In one embodiment, as described below, chassis 102 includes a plurality of sections for housing components therein. It is worth noting that any number of electronic modules, air movers and other components can be positioned with chassis 102 as desired.

In the illustrated embodiment, front region 104 includes a module or server region having plurality of upper bays 110 and lower bays 112 for housing electronic modules (e.g., server blades, storage blades, optical drives) and at least one airflow inlet, one of which is schematically illustrated as inlet 113, to allow air to flow into a front of the chassis 102. In one embodiment, front region 104 also houses one or more power supply modules in section 114.

In one embodiment, a frame 115 having a plurality of airflow openings for servers is also provided in front region 104 to provide a seal to central plenum 108. The airflow openings can be aligned with associated openings on servers positioned in upper bays 110 and lower bays 112. In one embodiment, each airflow opening in frame 115 includes a gate that is movable between an open position, which allows a maximum amount of airflow through the opening, and a closed position, which allows a minimum amount of airflow through the opening. If a server occupies one of the bays, the respective gate for the airflow opening of the bay will be open. If a server does not occupy one of the bays, the respective gate for the airflow opening of the bay will be closed. As a result, it is not necessary to have a server or blank installed in each bay to maintain proper airflow within chassis 102. In one embodiment, servers can be added to or removed from the bays 110 and 112 as desired while frame 115 automatically opens and closes the airflow openings based on whether the corresponding bay is occupied or unoccupied.

In one embodiment, back region 106 is adapted to house a plurality of air movers in sections 116 and 118 as well as other modules (e.g., keyboard video mouse modules, interconnect modules, onboard administration modules) in section 120. In one embodiment, a signal midplane module 122 is provided to transmit signals between servers in bays 110 and 112 to modules in section 120. Additionally, a backplane power module 124 is provided to distribute power from the power supply modules in section 114 to electrical components stored within chassis 102.

In one embodiment, the air movers in sections 116 and 118 seal into central plenum 108 and operate to bring air into chassis 102 through front region 104 and out at least one airflow outlet, one of which is schematically illustrated at outlet 119, in a rear of the chassis 102. Operation of the air movers thus creates a negative pressure region within central plenum 108.

Described below are exemplary embodiments of frames that can be positioned within chassis 102. The frames include gates that are, in one embodiment, pivotable about a first axis between an open position and a closed position. The gates can be coupled to a pinion that rotates about a second axis. In one embodiment, the first axis can be perpendicular to the second axis, as illustrated in FIGS. 2-5. In another embodiment, the first axis and second axis can be coaxial, as illustrated in FIG. 6-9. Other gate and actuators can also be used to selectively open and close airflow openings within corresponding frames.

Figure 2:
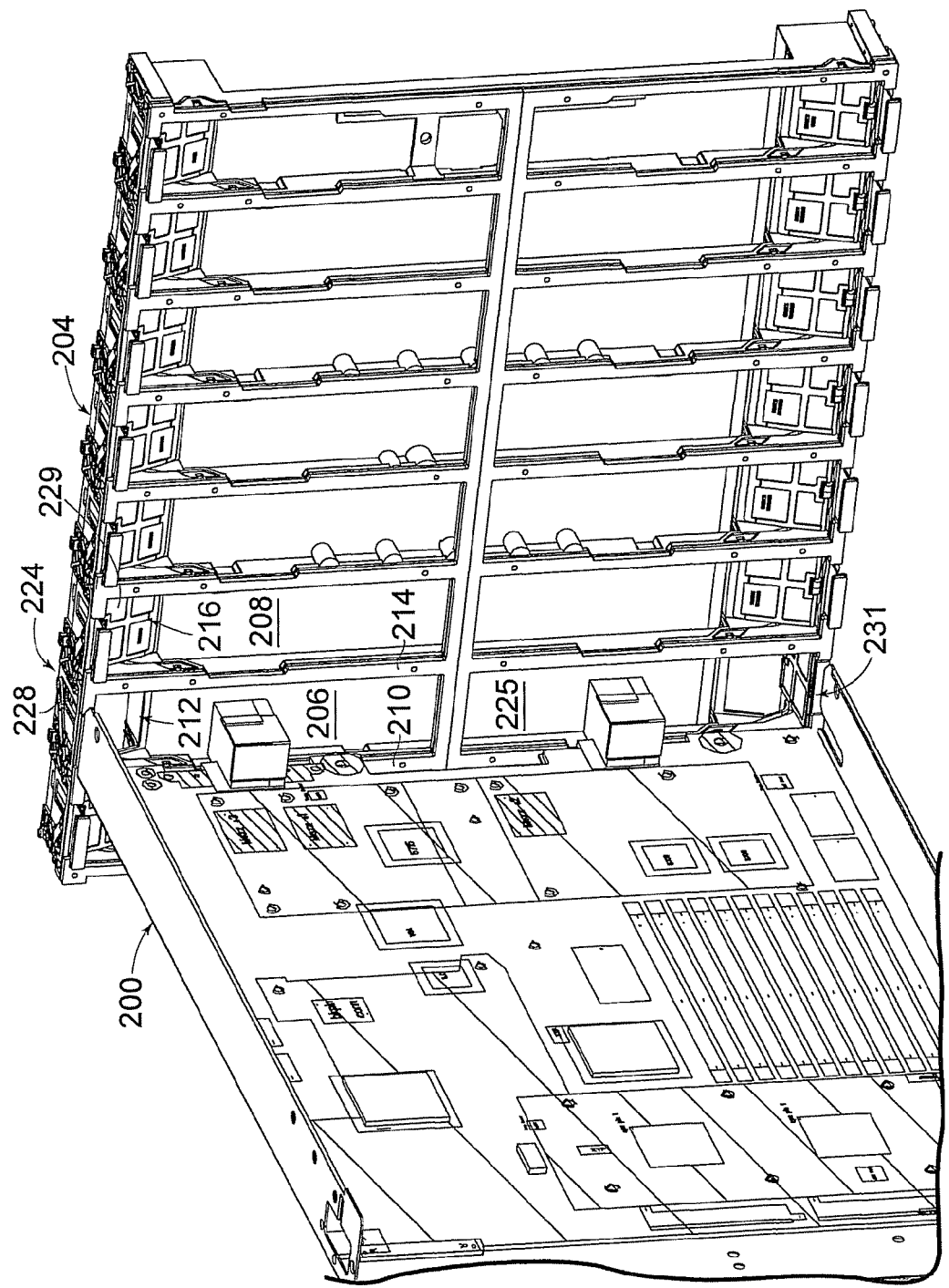
FIG. 2 is an isometric view of one embodiment of a blade server engaged with one embodiment of a frame of a server enclosure.

FIG. 2 is an isometric view of one embodiment of a blade server 200 engaged with one embodiment of a frame 204 that can be positioned within chassis 102 in a position similar to frame 115 of FIG. 1. In one embodiment, frame 204 includes a plurality of bays, for example, bays 206 and 208. Bay 206 includes a server engagement seal 210 and an airflow opening 212. Similarly, bay 208 includes a server engagement seal 214 and an airflow opening 216. Server engagement seals 210 and 214 can include an elastomeric member, in one embodiment, which can compress between server 200 and frame 204 when server 200 is engaged with frame 204.

In FIG. 2, airflow opening 212 is open to airflow since its corresponding gate 228 is in the open position whereas airflow opening 216 is closed to airflow since its corresponding gate 229 is in a closed position. In one embodiment, when server 200 is engaged with frame 204, a contact surface 222 is pushed towards frame 204, causing an actuator 224 to slide with respect to frame 204 and open gate 228 that allows airflow through airflow opening 212. In particular, the gate 228 moves between an open position, allowing a maximum amount of airflow through airflow opening 212, and a closed position, allowing a minimum amount of airflow through airflow opening 212. Actuator 224 is supported on a side of frame 204, for example top edge 256.

In the illustrated embodiment, a height of airflow openings 212 to 216 is less than half a height for associated bays 206 and 208, although other heights of airflow openings 212 and 216 can be used. It is also worth noting that server 200 is known as a full-high server, which occupies both bay 206, which is an upper bay of frame 204, and a lower bay 225 of frame 204. A full-high server will thus open both gate 228, as an upper gate, and a lower gate 231. A half-high server, however, occupies a single bay such as bay 206, thus opening a single gate, such as gate 228, within frame 204.

Figure 3:
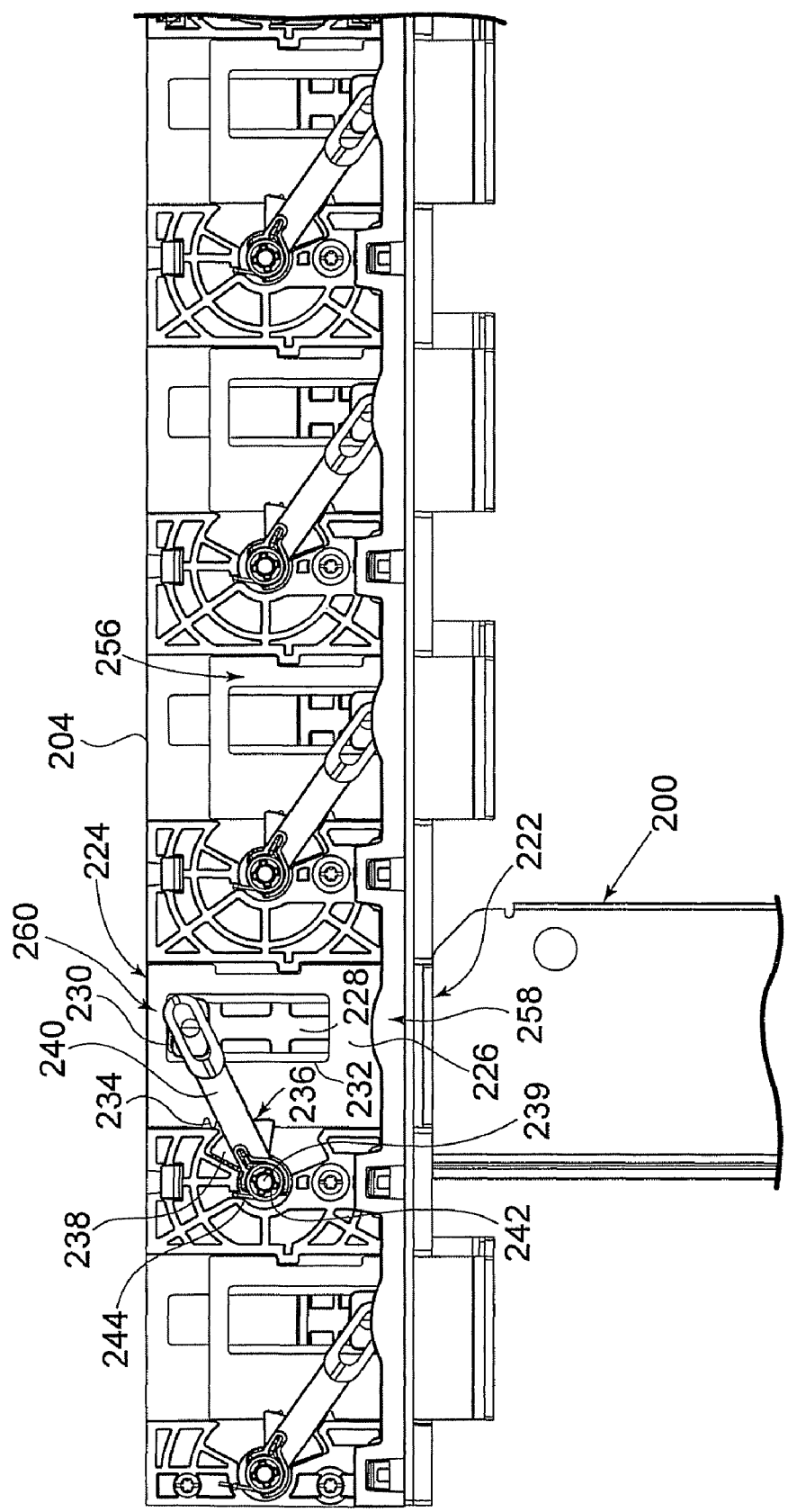
FIG. 3 is a top view of one embodiment of a gate and actuator in the frame of FIG. 2.
Figure 4:
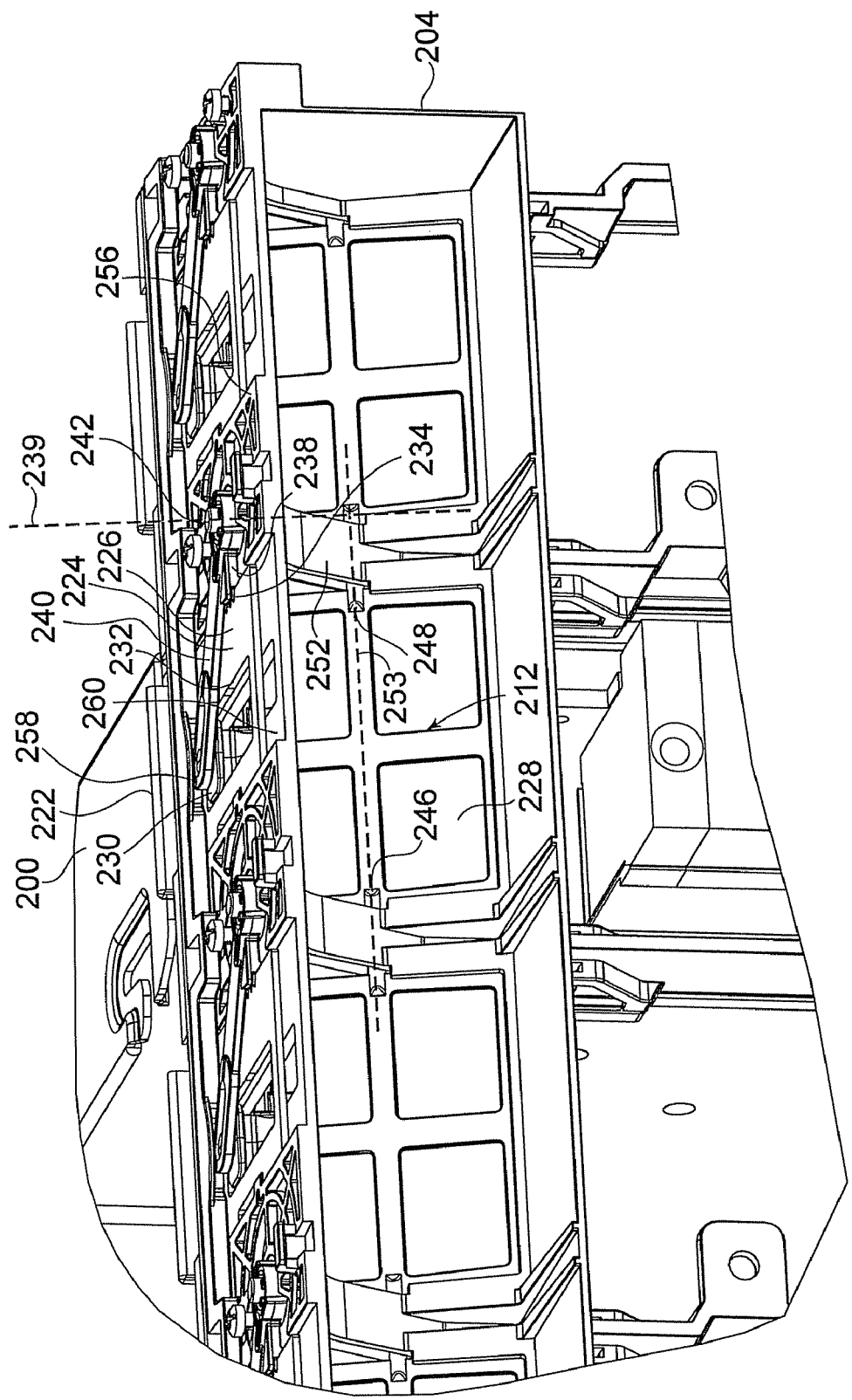
FIG. 4 is a rear view of the frame of FIG. 2 with the gate in a closed position.
Figure 5:
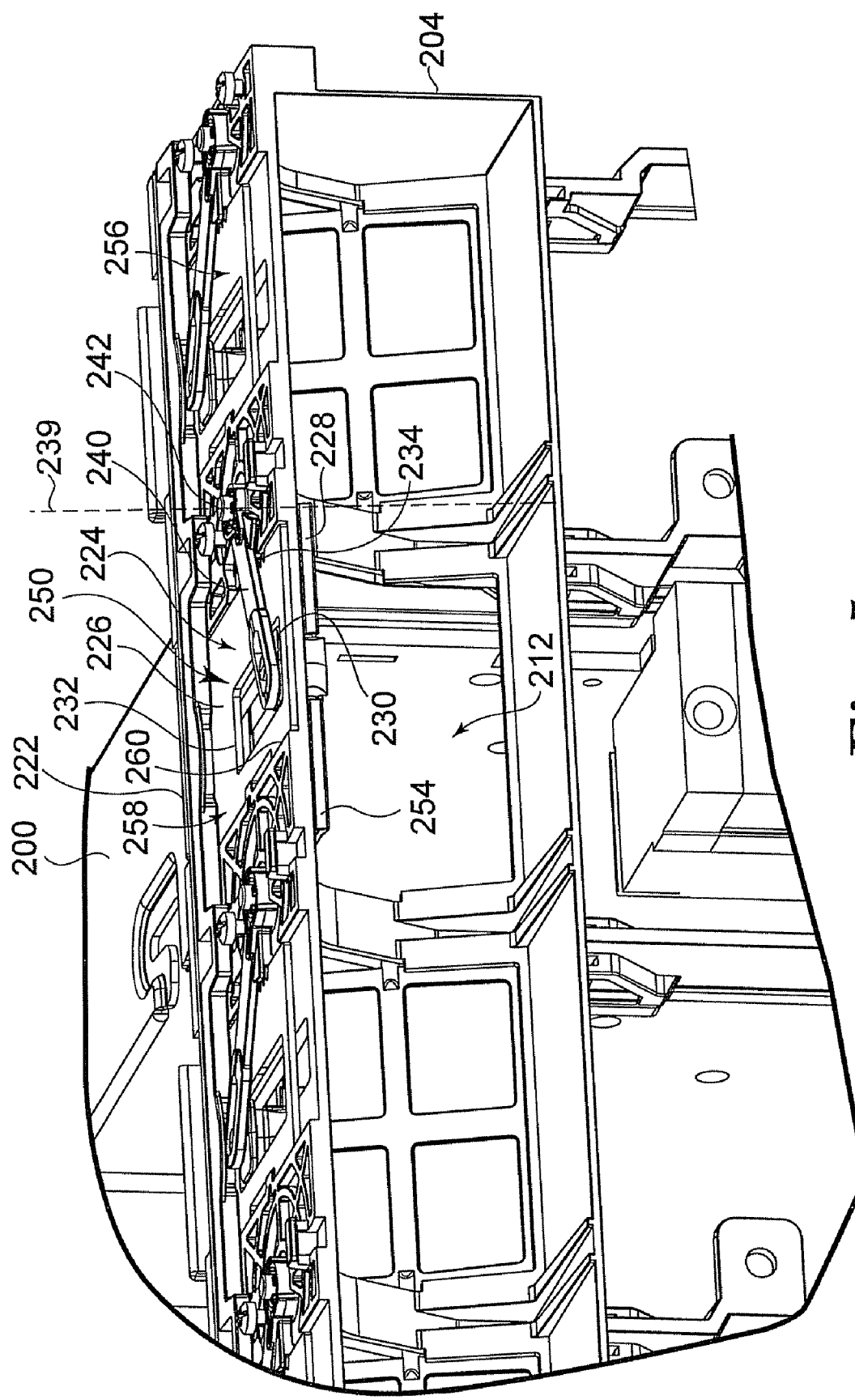
FIG. 5 is a rear view of the frame of FIG. 2 with the gate in an open position.

With reference to FIGS. 3-5, one embodiment of actuator 224 includes an actuator plate 226 coupled to gate 228 using a tab 230 slidable in a slot 232 of the actuator plate 226. In one embodiment, actuator plate 226 includes a rack 234 having a linear array of teeth oriented perpendicular to a front edge 235 of frame 204 that mesh with and engage corresponding teeth 236 on a rotating pinion 238. Pinion 238 rotates about an axis 239 and, in one embodiment, is coupled to tab 230 of gate 228 through a gear linkage 240. Gear linkage 240 is secured to pinion 238 so as to rotate therewith about a rotating pin 242 coinciding with axis 239. In one embodiment, a return spring 244 is coupled to pinion 238 and gear linkage 240 to bias the actuator plate 226 towards the front edge 235 of frame 204 and thus gate 228 to a closed position.

With further reference to FIGS. 4 and 5, one embodiment of gate 228 includes corresponding side pins 246 and 248 positioned within ramps 250 and 252, respectively. When actuator 224 moves gate 228 between the closed position and the open position, the side pins 246 and 248 travel along the ramps 250 and 252. In one embodiment, tab 230 is pivotally coupled to gate 228 such that gate 228 pivots about an axis 253 coaxial with side pins 246 and 248 of the gate 228 and parallel to top edge 256 of frame 204. As such, a top 254 of gate 228 moves from a front portion 258 of frame 204 to a rear portion 280 of frame 204.

FIGS. 6-9 illustrate another embodiment of a server 300 engaged with another embodiment of a frame 302 that can be positioned in chassis 102 similar to a position of frame 115 (FIG. 1). In one embodiment, frame 302 includes a plurality of bays, for example bays 304 and 305, and each bay includes a corresponding airflow opening and a gate that opens and closes the airflow opening when server 300 is engaged with or removed from frame 302. For example, when server 300 engages frame 302 in bay 304, an actuator 306, supported on a side of frame 302 such as top edge 309, is triggered which operates to open gate 308. In one embodiment, to open gate 308, gate 308 pivots about an axis 311, perpendicular to top edge 309 of frame 302. When gate 308 is in an open position, airflow is allowed to pass through airflow opening 310 in frame 302. In contrast to bay 304 having an open gate 308, bay 305, being unoccupied, includes a gate 312 in a closed position that prevents airflow through a corresponding airflow opening 313.

In the illustrated embodiment, airflow openings in frame 302, for example airflow openings 310 and 313, have a height that is less than half a height for associated bays in frame 302, for example bays 304 and 305. Additionally, server 300 is known as a half-high server, which only occupies a single bay 304 of frame 302 and operates to open a single gate 308 to allow airflow through airflow opening 310. A full-high server engaged with frame 302 would occupy both bay 304 and a lower bay 315 and open gate 308 as well as a lower gate 317.

Figure 6:
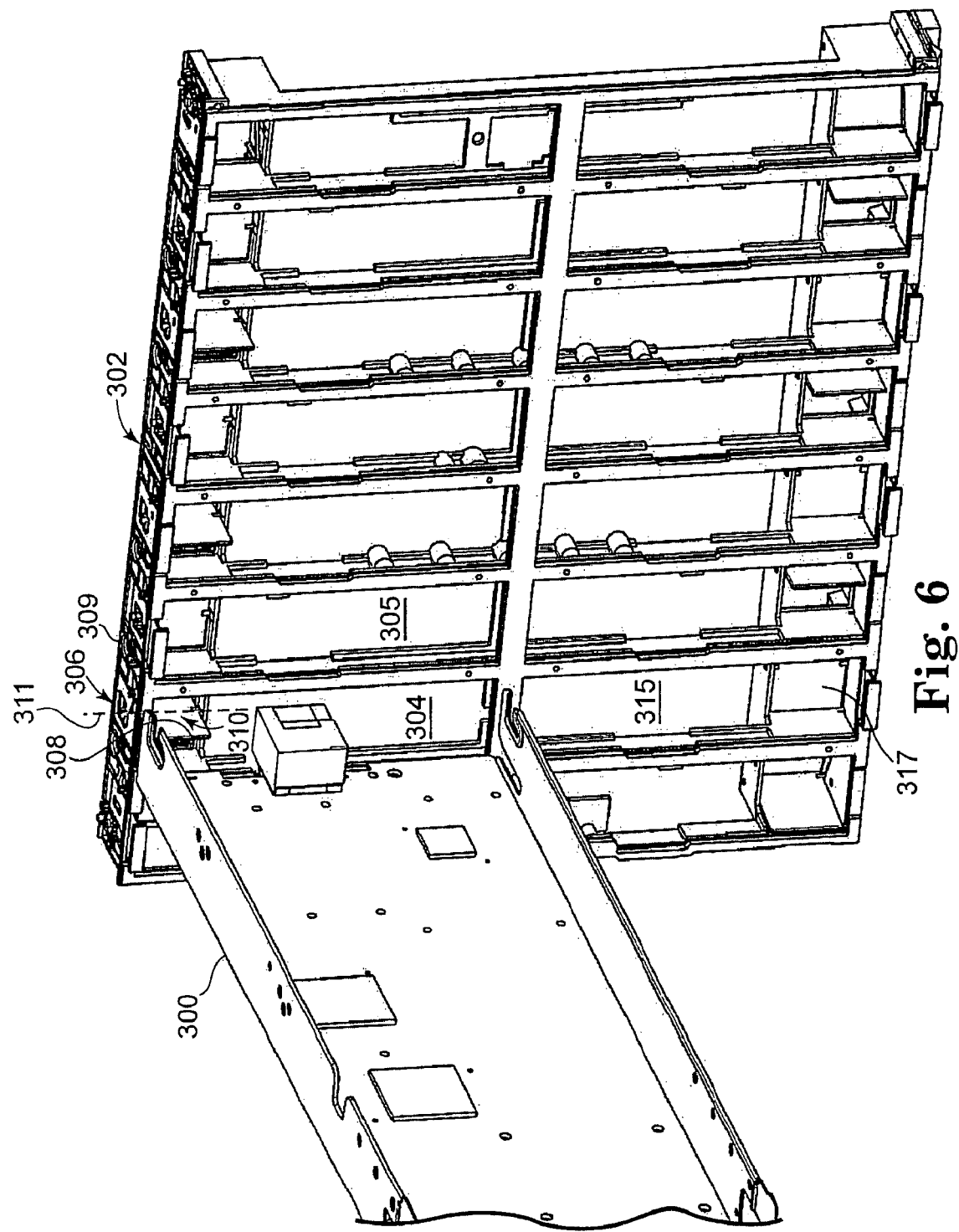
FIG. 6 is an isometric view of one embodiment of a blade server engaged with another embodiment of a frame of a server enclosure.
Figure 7:
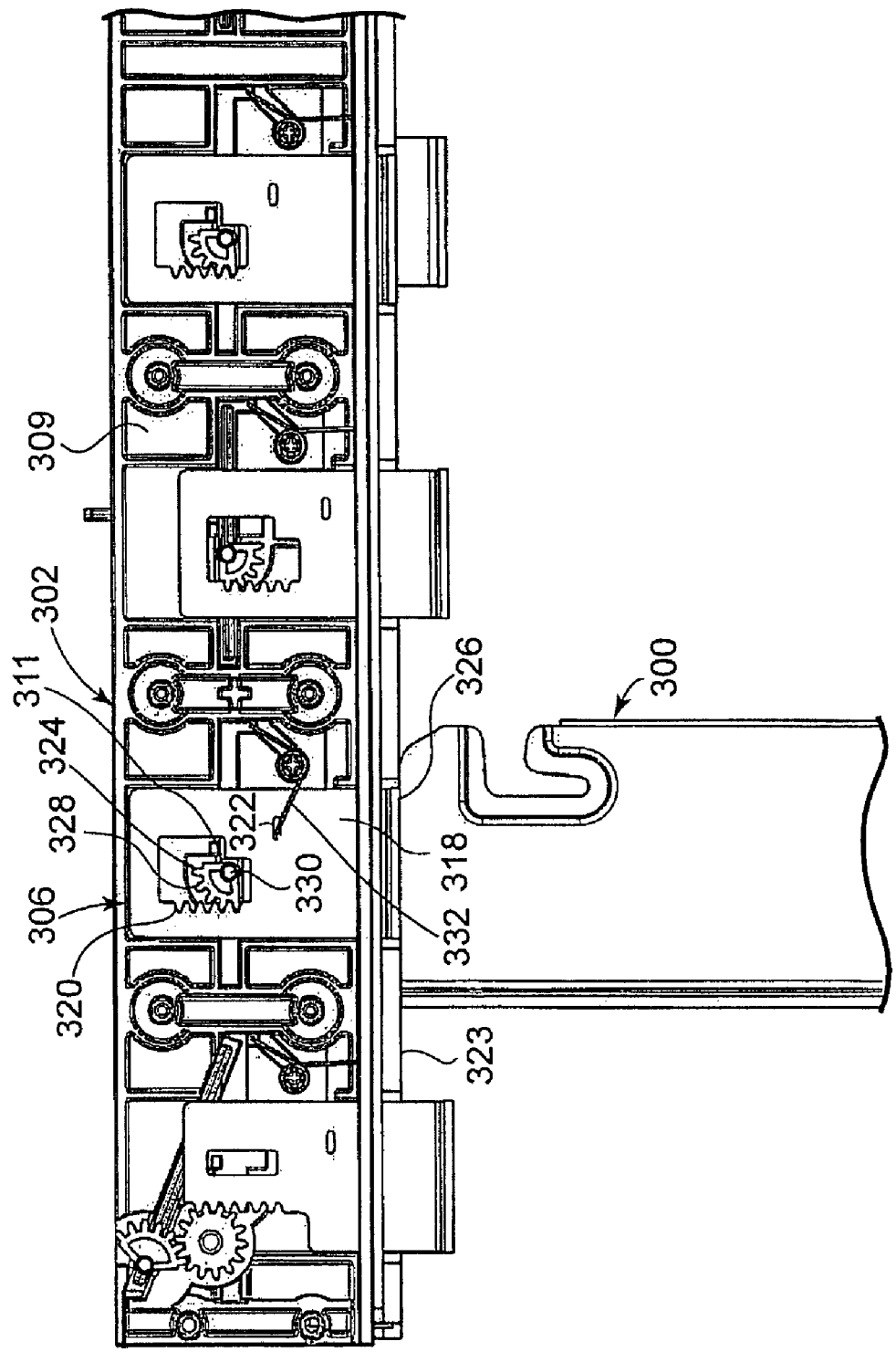
FIG. 7 is a top view of one embodiment of a gate and actuator of the frame of FIG. 6.

FIG. 7 is a top view of one embodiment of actuator 306. In one embodiment, actuator 306 includes an actuator plate 318 including a rack 320 having a linear array of teeth and a slot 322. In one embodiment, the linear array of teeth of rack 320 are oriented perpendicular to a front edge 323 of frame 302 and mesh with and engage a pinion 324 coupled to gate 308 (FIG. 6). In one embodiment, server 300 engages a contact surface 326 of actuator plate 318 to move actuator plate 318 with respect to frame 302. As actuator plate 318 moves with respect to frame 302, rack 320 meshes with and engages corresponding teeth 328 on a pinion 324 in order to rotate gate 308 (FIG. 6) to an open position. Gate 308 and pinion 324 rotate about axis 311, which is perpendicular to top edge 309 of frame 304, and an orientation of teeth on rack 320. In one embodiment, in order to return gate 308 to a closed position, a return spring 332 engages slot 322. In one embodiment, when server blade 300 is released from frame 302, return spring 332 moves actuator plate 318 toward the front edge 323 of frame 302, thus rotating gate 308 to the closed position, wherein gate 308 is oriented parallel to front edge 323 of frame 302.

Figure 8:
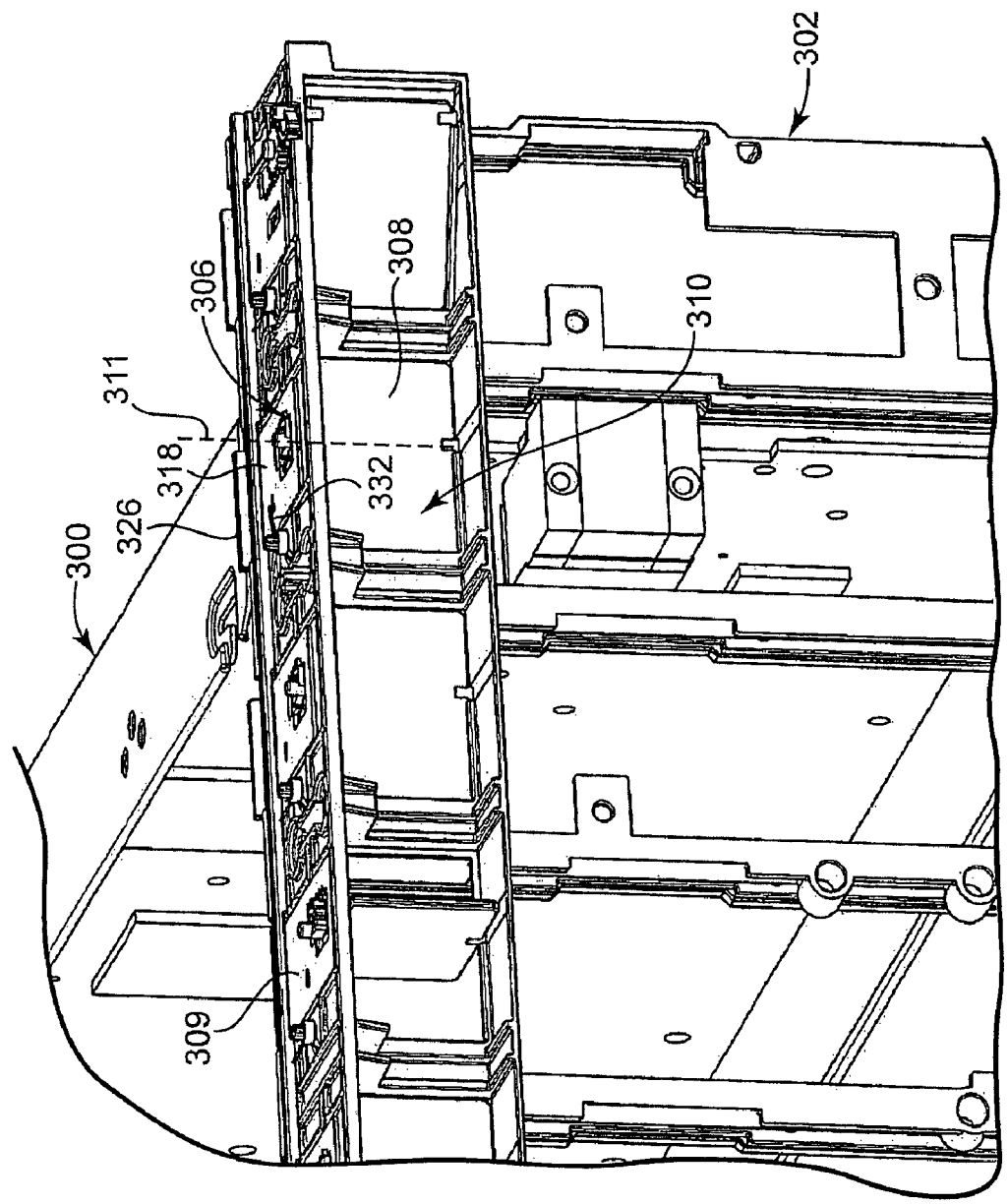
FIG. 8 is a rear view of the frame of FIG. 6 with the gate in a closed position.
Figure 9:
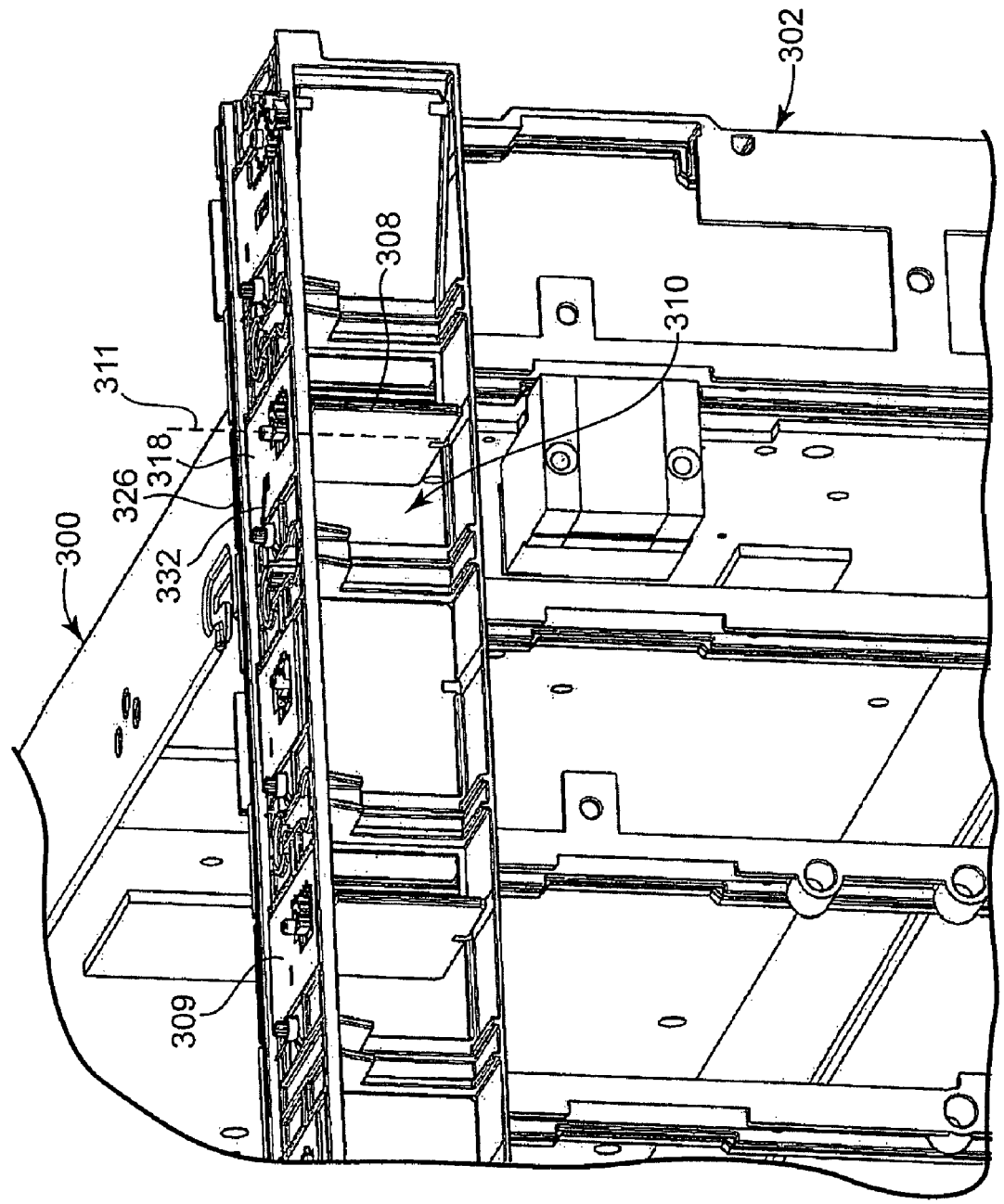
FIG. 9 is a rear view of the frame of FIG. 6 with the gate in an open position.

With reference to FIGS. 8 and 9, server 300 engages contact surface 326 of actuator 306. As server 300 engages frame 302, gate 308 pivots about axis 311 to move from a closed position, shown in FIG. 8, to an open position, shown in FIG. 9. Airflow can pass through airflow opening 310 when gate 308 is in the open position of FIG. 9. When server 300 is removed from engagement with frame 302, return spring 332 biases contact surface 326 away from frame 302 and pivots gate 308 to the closed position of FIG. 8.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. An apparatus for adjusting airflow in an enclosure for an electronic module, comprising:
  a frame having an airflow opening configured to direct airflow in an airflow direction;
  a gate positioned within the airflow opening and pivotable about a first axis parallel to a top edge of the frame, the gate including side pins positioned within ramps of the frame;

a pinion coupled to the gate and rotatable about a second axis, the second axis being perpendicular to the airflow direction and the first axis; and an actuator having an actuator plate slidable with respect to the frame in the airflow direction and defining a contact surface configured to engage the electronic module and be pushed towards the frame in the airflow direction, the actuator supported on the top edge of the frame and comprising a rack meshed with the pinion such that movement of the actuator causes the side pins of the gate to travel along the ramps and the gate to pivot about the first axis coaxial with the side pins of the gate between open and closed positions, wherein the open and closed positions allow, respectively, maximum and minimum airflow through the airflow opening.

2. The apparatus of claim 1 and further comprising a return spring coupled to the actuator to bias the gate to the closed position.

3. The apparatus of claim 1 wherein the actuator plate maintains a linear array of teeth arranged parallel to the airflow direction.

4. The apparatus of claim 1 wherein the airflow opening is formed in a bay of the frame, the bay configured to receive the electronic module, and the airflow opening having a height less than half a height of the bay.

5. The apparatus of claim 1 wherein the rack includes a linear array of teeth oriented perpendicular to the first axis.

6. An enclosure for electronic modules, comprising:
a chassis having a module region adapted to house the electronic modules and an air plenum positioned to receive airflow from the module region; and
a frame positioned between the module region and the air plenum and having a plurality of bays adapted to receive the electronic modules, each bay comprising:
an airflow opening configured to allow airflow in an airflow direction from the module region to the air plenum;
a gate positioned within the airflow opening and pivotable about a first axis parallel to a top edge of the frame, the gate including side pins positioned within ramps of the frame;
a pinion coupled to the gate and rotatable about a second axis perpendicular to the airflow direction and the first axis; and
an actuator having an actuator plate slidable with respect to the frame in the airflow direction and defining a contact surface configured to engage the electronic module and be pushed towards the frame in the airflow direction, the actuator supported on the top edge of the frame and comprising a rack meshed with the pinion such that movement of the actuator causes the side pins of the gate to ravel along the ramps and the gate to pivot about the first axis coaxial with the side pins of the gate between open and closed positions, wherein the open and closed positions allow, respectively, maximum and minimum airflow through the airflow opening.

7. The server enclosure of claim 6 wherein each bay further includes a return spring coupled to the actuator to bias the gate to the closed position.

8. The enclosure of claim 6 wherein each actuator plate maintains a linear array of teeth oriented parallel to the direction.

9. The enclosure of claim 6, wherein for each bay, a height of each airflow opening is less than half a height of each bay.

10. The enclosure of claim 6 wherein one of the plurality of bays is an occupied bay such that a corresponding gate for the occupied bay is in the open position, and one of the plurality of bays is an unoccupied bay such that a corresponding gate for the unoccupied bay is in the closed position.

11. A method of adjusting airflow in an enclosure for an electronic module, comprising:
positioning a frame having a top edge within a chassis of the enclosure, the frame having an airflow opening configured to direct airflow in an airflow direction;
providing a gate pivotable about an axis parallel to the top edge between open and closed positions within the airflow opening, the gate including side pins positioned within ramps of the frame the open and closed positions allowing, respectively, maximum and minimum airflow through the airflow opening;
coupling an actuator to the gate; and
positioning the electronic module in the frame and contacting an actuator plate on the actuator to slide the actuator plate with respect to the frame, cause the side pins of the gate to travel along the ramps and pivot the gate about the axis coaxial with the side pins of the gate from the closed position to the open position, the actuator plate slidable with respect to the frame in the airflow direction and defining a contact surface configured to engage the electronic module and be pushed toward the frame in the airflow direction.

12. The method of claim 11 wherein the actuator plate includes a rack meshed with gear teeth on a pinion rotatable about an axis.

13. The method of claim 11 and further comprising:
coupling a return spring to the actuator plate to bias the gate towards the closed position.

14. The method of claim 11 and further comprising:
removing the electronic module from the frame and automatically actuating the gate from the open position to the closed position.

* * * * *

UNITED STATES PATENT AND TRADEMARK OFFICE
CERTIFICATE OF CORRECTION

| | | |
|---|---|---|
| PATENT NO. | : 7,817,430 B2 | Page 1 of 1 |
| APPLICATION NO. | : 12/138189 | |
| DATED | : October 19, 2010 | |
| INVENTOR(S) | : David W. Sherrod et al. | |

It is certified that error appears in the above-identified patent and that said Letters Patent is hereby corrected as shown below:

In column 6, line 5, in Claim 7, before "enclosure" delete "server".

In column 6, line 26, in Claim 11, delete "frame" and insert -- frame, --, therefor.

Signed and Sealed this
Twenty-ninth Day of March, 2011

David J. Kappos
*Director of the United States Patent and Trademark Office*